(12) United States Patent
Morita (10) Patent No.: US 6,232,623 B1
(45) Date of Patent: May 15, 2001

(54) SEMICONDUCTOR DEVICE ON A SAPPHIRE SUBSTRATE

(75) Inventor: Etsuo Morita, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/334,666

(22) Filed: Jun. 17, 1999

(30) Foreign Application Priority Data

Jun. 26, 1998 (JP) .................................................. 10-180930

(51) Int. Cl.⁷ .............................. H01L 33/00; H01L 29/04
(52) U.S. Cl. .......................... 257/103; 257/622; 257/627; 257/628; 257/631
(58) Field of Search ................................ 372/45, 46, 44; 257/103, 622, 627, 628, 631

(56) References Cited

U.S. PATENT DOCUMENTS 5,604,763 * 2/1997 Kato et al. ............................... 372/45
5,919,305 * 7/1999 Solomon ................................. 117/90

\* cited by examiner

*Primary Examiner*—Minh Loan Tran
(74) *Attorney, Agent, or Firm*—Sonnenschein Nath & Rosenthal (57) ABSTRACT

To improve crystallographic property of a nitride III–V compound semiconductor layer grown on a sapphire substrate, a plurality of recesses are made on a major surface of the sapphire substrate, and the nitride III–V compound semiconductor layer is grown thereon. At least a part of the inner surface of each recess makes an angle not less than 10 degrees with respect to the major surface of the sapphire substrate. The recesses are buried with nitride III–V compound semiconductor crystal having a higher Al composition ratio than the nitride III–V compound semiconductor layer, such as $Al_xGa_{1-x}N$ crystal whose Al composition ratio x is 0.2 or more, for example. Each recess has a depth not less than 25 nm and a width not less than 30 nm. The recesses may be made either upon thermal cleaning of the sapphire substrate or by using lithography and etching, thermal etching, or the like.

11 Claims, 6 Drawing Sheets

SEMICONDUCTOR DEVICE ON A SAPPHIRE SUBSTRATE

RELATED APPLICATION DATA

The present application claims priority to Japanese Application No. P10-180930 filed Jun. 26, 1998, which application is incorporated herein by reference to the extent permitted by law.

BACKGROUND OF THE INVENTION

1. Field of the Invention

This invention relates to a semiconductor device and its manufacturing method especially suitable for application to semiconductor lasers and light emitting diodes or electron mobility devices using nitride III–V compound semiconductors such as GaN.

2. Description of the Related Art

Heretofore, semiconductor lasers and light emitting diodes have been developed, using nitride III. V compound semiconductors made of group III elements such as Al, Ga and In and group V elements including N, as represented by GaN, as their light emitting materials in the range extending from green or blue to ultraviolet. On the other hand, although continuous oscillation at room temperatures has been realized with semiconductor lasers, there is still the need for further improvement in crystallographic property of nitride III–V compound semiconductors toward their longer lifetime. For this purpose, a technique for improving crystallographic property of GaN such as ELOG-GaN (Epitaxially Laterally Overgrown GaN) is being used and actually performing effects. However, it is also desired to further improve the basis of the technique, namely, crystallographic property of nitride III–V compound semiconductors grown on crystalline substrates.

Usually used as a substrate crystal is sapphire or SiC. Nitride III–V compound semiconductor layers are grown on such a crystalline substrate after it is processed in a growth apparatus for sufficiently smoothing, polishing and cleaning its surface. In order to manufacture a desired semiconductor device, it is necessary to make various multi-layered structures having surfaces or interface structures which are flat in the atomic level. Therefore, also for substrates, surface cleaning methods and growth methods capable of maintaining or making their surfaces flat are being used.

There has also been proposed a method which improves crystalline property of nitride III–V compound semiconductor layers by slightly inclining a crystalline substrate surface such that layers be grown thereon in a step flow mode (Japanese Patent Lai-Open Publication No. hei 7-201745).

When using a GaAs substrate or InP substrate, a technique is being used, which first grows a buffer layer on a substrate having formed on its (001) surface a (111)B-oriented diffraction grating for the purpose of reflecting guided light in the waveguide. (Japanese Patent Laid-Open Publication No. hei 8-264901).

Also known are a method for improving crystalline property by interposing an AlN buffer layer (Japanese Patent Laid-Open Publication No. hei 2-229476) or a GaN or AlGaN buffer layer (Japanese Patent Laid Open Publication No. hei 4-297023) between a sapphire substrate and a nitride III–V compound semiconductor thereon; a method for improving by nitrifying a sapphire substrate surface (Japanese Patent Laid Open Publication No. hei 5-41541). Also known is a method which sequential stacks a plurality of buffer layers different in lattice constant to reduce differences in lattice constant between the substrate and the buffer layer and between the buffer layer and an epitaxial layer thereon (Japanese Patent Laid Open Publication No. hei 9-63962).

It is generally noted that "fluctuation" in crystalline orientation exists in nitride III–V compound semiconductor crystals grown on a sapphire or SiC substrate. That is, these nitride III–V compound semiconductor crystals are "mosaic crystals". Fluctuation in crystalline orientation is roughly classified into two components, namely, "twist" mosaic components which fluctuate in a rotational direction around an axis vertical to the substrate surface, and "tilt" mosaic components which are fluctuation in axial orientation from a vertical direction. Magnitude of these fluctuations is noted to be normally 0.01 to 0.5°. Causes of fluctuation in crystalline orientation are considered to lie in a difference in crystalline structure between the substrate and a nitride III–V compound semiconductor layer grown thereon and a large difference in lattice constant between them. It is also considered to be another factor that, crystal orientation is not accurately carried over during growth from the sapphire substrate because of relatively weak atomic coupling between stable sapphire crystal and a nitride III–V compound semiconductor crystal as compared with those inside these crystals.

Due to such mosaic crystalline property, in semiconductor light emitting devices using nitride III–V compound semiconductors, improvement in device characteristics has been prevented, by degradation in emission efficiency, and there are problems such as short lifetime regarding reliability required for the device.

OBJECT AND SUMMARY OF THE INVENTION

It is therefore an object of the invention to provide a semiconductor device and its manufacturing method capable of improving crystalline property of a nitride III–V compound semiconductor layer grown on a sapphire substrate.

The Inventor made researches to overcome the above-mentioned problems involved in conventional techniques, as summarized below.

The Inventor made researches to find optimum surface states of a sapphire substrate for improving crystalline property of nitride III–V compound semiconductors grown on the sapphire substrate. It has been believed that being smoother is more desirable for surfaces of sapphire substrates, and efforts have been made for smoothing. For example, Japanese Patent Laid-Open Publication No. hei 8-83802, for example, proposes a technique for obtaining a super-smooth substrate surface exclusively made of terrace surfaces substantially equal in crystalline orientation and having a straight, regular step site, by selecting a heating time and a heating temperature in accordance with the surface orientation upon annealing a sapphire substrate by raising the temperature to 900° C. or higher in a normal pressure atmosphere.

However, according to researches by the Inventor, it is better to positively make recesses on the surface of a sapphire substrate, in contrast to smoothing mentioned above, for the purpose of increasing crystalline property of nitride III–V compound semiconductors grown on the sapphire substrate. This is for the reason explained below.

In the process of crystal growth (including vapor-phase growth and solid-phase growth) on a smooth sapphire substrate surface, crystalline orientation of a nitride III–V compound semiconductor crystal under growth is determined exclusively by interaction between atoms of the nitride III–V compound semiconductor and atoms of the sapphire crystal interposing only one interface parallel to the substrate surface. Therefore, if the interaction at the interface is not large, fluctuation in crystalline orientation mentioned above increases. Especially, control of fluctuation in crystalline orientation along the plane (twist component) becomes weak. In contrast, along the interface having recesses, crystalline orientation can be controlled as a result of limitation of crystalline orientation by lateral constraint force applied through a slanted crystal surface not parallel to the substrate. Therefore, it is possible to establish more precise coincidence in crystalline orientation between the sapphire substrate and a nitride III–V compound semiconductor crystal grown thereon.

In a method using a step-shaped sightly angled substrate uniform in crystalline orientation, constraint of crystalline orientation is one direction. In contrast, in the case where a sapphire substrate surface has formed recesses, growth of a nitride III–V compound semiconductor on the sapphire substrate is restricted by a plurality of crystal directions and crystal surfaces. Therefore, a larger effect can be obtained regarding coincidence in crystalline orientation between the sapphire substrate and a nitride III–V compound semiconductor layer grown thereon.

The present invention has been made on the above-explained researches by the Inventor.

According to the first aspect of the invention, there is provided a semiconductor device using a nitride III–V compound semiconductor layer grown on a sapphire substrate, comprising:

recesses made on the sapphire substrate along an interface thereof with the nitride III–V compound semiconductor layer.

According to the second aspect of the invention, there is provided a manufacturing method of a semiconductor device using a nitride III–V compound semiconductor layer grown on a sapphire substrate, comprising:

first forming recesses on a major surface of the sapphire substrate, and thereafter growing the nitride III–V compound semiconductor layer on the major surface of the sapphire substrate.

In the present invention, from the viewpoint of restricting growth by a plurality of crystalline directions and crystal surfaces when growing the nitride III–V compound semiconductor layer on the sapphire substrate to ensure more precise coincidence in crystalline orientation between the sapphire substrate and the nitride III–V compound semiconductor layer grown thereon, at least a part of the inner surface of each recess on the sapphire substrate is preferably angled by 10 degrees or more from one major surface of the sapphire substrate. As to the size of each recess, its depth is preferably not smaller than 25 nm and the width is not smaller than 30 nm, from the same viewpoint. Alternatively, from the viewpoint of facilitating diffusion of Al from the sapphire substrate as explained later, depth of each recess is 10 nm or more, and its width is 30 nm or more. Width of each recess is preferably 5 $\mu$m or less, and typically 2 $\mu$m or less.

In the present invention, one major surface of the sapphire substrate is typically made up of surfaces inclined by a slight angle from the (0001) plane (so-called c plane) or the (0001) plane of the sapphire crystal. The slight angle herein means any angle within 10 degrees. In the case where one major surface of the sapphire substrate includes these surfaces, various crystalline planes may appear on inner surfaces of the recesses. More specifically, the {11-26} plane and the {11-29} plane of sapphire crystal, for example, appear. According to measurement of angles of crystalline planes on inner surfaces of recesses actually made, these two crystalline planes or planes with an angle between them were confirmed, although depending upon recesses.

In this invention, the recesses of the sapphire substrate after growth of the nitride III–V compound semiconductor layer are plugged with nitride III–V compound semiconductor crystal having a uniform crystalline orientation. However, all of the recesses need not be always plugged with nitride III–V compound semiconductor crystal. The nitride III–V compound semiconductor plugged into the recesses and having a uniform crystalline orientation can be made by first growing a buffer layer of a nitride III–V compound semiconductor on the sapphire substrate having formed the recesses on its major surface and thereafter annealing it at a higher temperature. This method is suitable when using a process of first growing a buffer layer of a nitride III–V compound semiconductor on a sapphire substrate at a lower temperature and thereafter growing the nitride III–V compound semiconductor layer on the buffer layer at a higher substrate temperature. However, if the process from growth of the buffer layer to growth of the nitride III–V compound semiconductor layer thereon is progressed while continuously increasing the substrate temperature from a low temperature to a high temperature, then a multi-layered structure with no irregular interface caused by interruption of growth can be realized. As an alternative method, it is possible to grow the nitride III–V compound semiconductor layer directly on the sapphire substrate without growing the buffer layer while increasing the substrate temperature from a low temperature to a high temperature so as to plug the nitride III–V compound semiconductor crystal into the recesses of the sapphire substrate. More specifically, growth of the nitride III–V compound semiconductor layer is started from a substrate temperature around 500 to 520° C., for example, and the growth is continued while increasing the substrate temperature to 1000 through 1100° C. Then, when the substrate temperature rises to 1000 through 1100° C., the growth is still continued maintaining the substrate temperature. However, if a layer containing In, such as GaInN layer is to be grown as the nitride III–V compound semiconductor, it is grown at a substrate temperature within 700 to 800° C.

It can be known from the presence of absence of moire fringes through a transmission electron microscope that nitride III–V compound semiconductor crystal having a uniform crystalline orientation is formed in the recesses on the sapphire substrate. For example, on a transmission electron microscopic image taken by exciting at least (0002) reflection of nitride III–V compound semiconductor crystal and (0006) reflection of sapphire crystal, by observing moire fringes by these lattice surfaces, which appear inside the recesses on the sapphire substrate, growth of nitride III–V compound semiconductor crystal having a uniform crystalline orientation can be confirmed. These moire fringes have a distance depending on components and composition of nitride III–V compound semiconductor crystal which has been grown.

In this invention, typically made to bury recesses on the sapphire substrate is a buffer layer made of nitride III–V compound semiconductor crystal incorporating Al diffusing from the sapphire substrate made of $Al_2O_3$ and having a higher Al composition ratio along the interface between the sapphire substrate and the nitride III–V compound semiconductor layer thereon. The nitride III–V compound semiconductor crystal with a higher Al composition ratio may buried only in the recesses on the sapphire substrate. Since the recesses are provided on the sapphire substrate along the interface with the buffer layer, the contact area between the sapphire substrate and the buffer layer increases only by the areas of the inner surface of the recesses. Therefore, Al diffuses easily from the sapphire substrate to the buffer layer. For example, in the case where the nitride III–V compound semiconductor layer is made of $Al_{x1}Ga_{1-x1-y1}In_{y1}N$ (0 x1 1, 0 y1 1, 0 x1+y1 1) and the nitride III–V compound semiconductor crystal is made of $Al_{x2}Ga_{1-x2-y2}In_{y2}N$ (0 x2 1, 0 y2 1, 0 x2+y2 1), x2–x1 0.1 is preferably satisfied. As a result of the nitride III–V compound semiconductor crystal with a higher Al composition ratio being made, the following effects are obtained. That is, if the nitride III–V compound semiconductor layer is a GaN layer, for example, the nitride III–V compound semiconductor crystal with a higher Al composition ratio should be AlGaN crystal. This AlGaN crystal continuously couples the sapphire substrate and the GaN layer via Al, and alleviates the difference in lattice constant between the sapphire substrate and the GaN layer because AlGaN crystal has a lattice constant nearer to the sapphire substrate than the GaN layer. Additionally, dislocation of mismatching caused by a difference in lattice constant can be decreased. The nitride III–V compound semiconductor crystal with a higher Al composition ratio can be made by annealing during the substrate temperature being increased after growth of the buffer layer at a low temperature. Alternatively, if the nitride III–V compound semiconductor layer is directly growing on the sapphire substrate, without growing the buffer layer, while increasing the substrate temperature from a low temperature to a high temperature, the nitride III–V compound semiconductor crystal can be made in the process of increasing the substrate temperature. Furthermore, from the viewpoint of effectively diffusing Al from the sapphire substrate, a layer containing Al and N is preferably made by nitrifying the major surface of the sapphire substrate by exposing it to a gas containing nitrogen prior to the growth. In these cases, since the recesses are formed on the sapphire substrate, the contact area along the interface between the sapphire substrate and the layer grown thereon increases, and diffusion and reaction of Al are promoted.

It can be confirmed by observing moire fringes through transmission electron microscopy that the nitride III–V compound semiconductor crystal with a higher Al composition ratio is formed along the interface between the sapphire substrate and the nitride III–V compound semiconductor layer. More specifically, it is confirmed by observing moire fringes with a distance of 0.8 to 1.7 nm along the interface region on a transmission electron microscopic image taken by exciting at least (0002) reflection of the nitride III–V compound semiconductor crystal and (0006) reflection of sapphire substrate, or by observing moire fringes with a distance of 1 to 2.1 nm along the interface region on a transmission electron microscopic image taken by exciting at least (01–10) reflection of the nitride III–V compound semiconductor crystal and (11–20) reflection of sapphire substrate, or by observing moire fringes with a distance of 0.6 to 1.2 nm on a transmission electron microscopic image taken by exciting at least (0–220) reflection of the nitride III–V compound semiconductor crystal and (03–30) reflection of sapphire crystal.

In the present invention, the nitride III–V compound semiconductor is made up of at least one group III element selected from the group consisting of Ga, Al, In and B and one or more group V elements which includes N and may additionally include As or P. Specific examples thereof are GaN, InN, AlN, AlGaN, GaInN and AlGaInN.

In this invention, metal organic chemical vapor deposition (MOCVD) or molecular beam epitaxy(MBE), for example may be used for growth of the nitride III–V compound semiconductor layer.

In this embodiment, the semiconductor device may be any essentially. Specific examples thereof are light emitting devices such as semiconductor laser or light emitting diode, and electron mobility devices such as GaN FET.

According to the invention having the above-summarized features, since the recesses are made on one major surface of the sapphire substrate, growth of the nitride III–V compound semiconductor layer on the sapphire substrate can be controlled by a plurality of crystalline directions and crystalline planes. As a result, precise coincidence in crystalline orientation is ensured between the sapphire substrate and the nitride III–V compound semiconductor grown thereon.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Explained below are embodiments of the invention with reference to the drawings. In all drawings illustrating the embodiments, the same or equivalent parts or components are labeled with common reference numerals.

Figure 1:
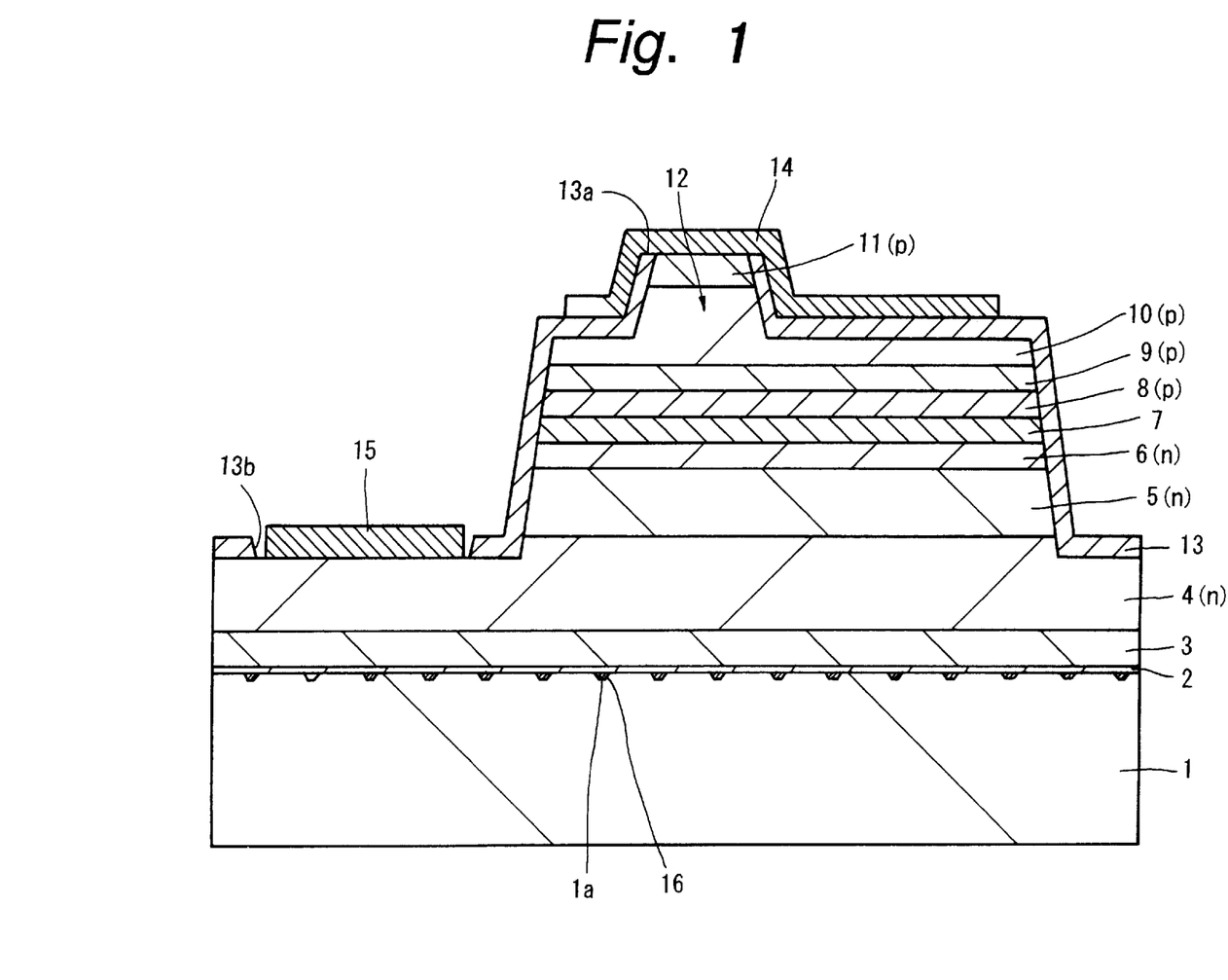
FIG. 1 is a cross-sectional view taken along a plane vertical to the cavity lengthwise direction of a GaN semiconductor laser according to the first embodiment of the invention.
Figure 2:
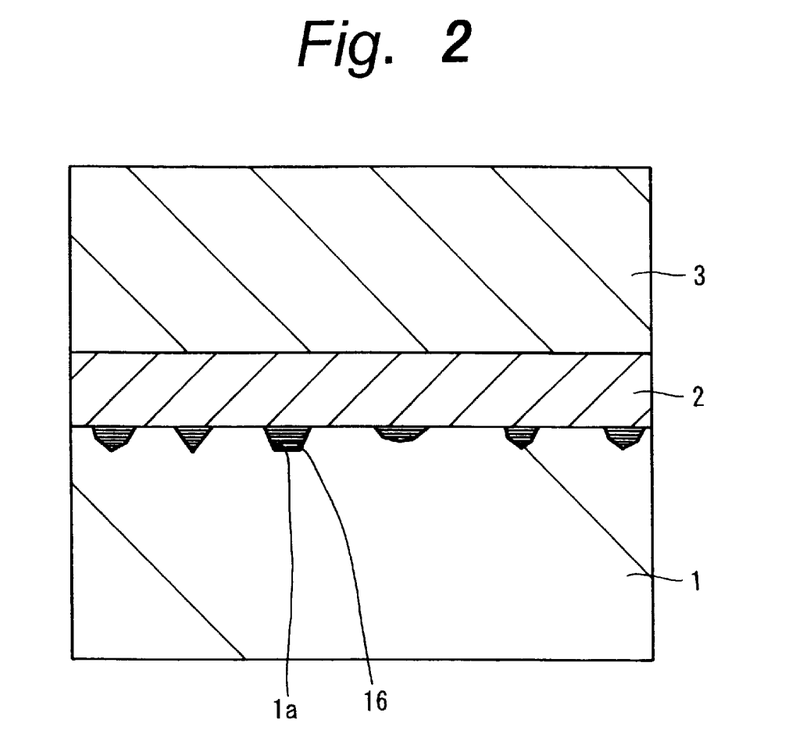
FIG. 2 is a cross-sectional view showing a part of the GaN semiconductor laser according to the first embodiment of the invention in an enlarged scale.
Figure 3A:
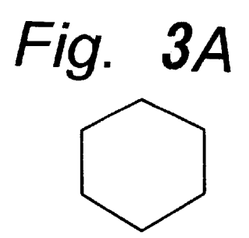
FIGS. 3A to 3F are plan views showing plan-view configurations of recesses to be formed on a surface of a c-plane sapphire substrate in the GaN semiconductor laser according to the first embodiment of the invention.
Figure 3B:
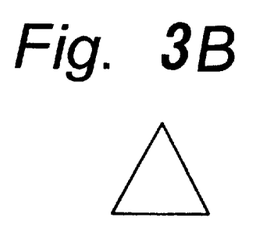
Figure 3C:
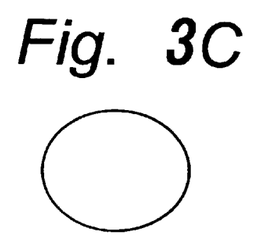
Figure 3D:
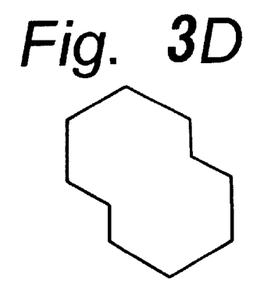
Figure 3E:
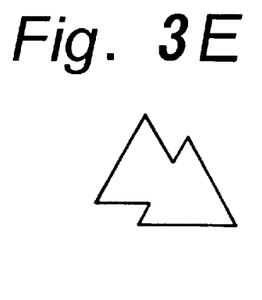
Figure 3F:
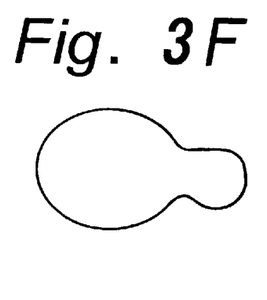

FIG. 1 shows a GaN semiconductor laser according to the first embodiment of the invention, and FIG. 2 shows a part of the GaN semiconductor laser near the substrate surface in an enlarged scale. The GaN semiconductor laser has a SCH structure (separate confinement hetero-structure).

As shown in FIGS. 1 and 2, in the GaN semiconductor laser according to the first embodiment, sequentially stacked on a c-plane sapphire substrate 1 via a GaN buffer layer 2 are: an undoped GaN layer 3, n-type GaN contact layer 4, n-type AlGaN cladding layer 5, n-type GaN optical guide layer 6, active layer 7 with a $Ga_{1-x}In_xN/Ga_{1-y}In_yN$ multi quantum well structure, p-type AlGaN cap layer 8, p-type GaN optical guide layer 9, p-type AlGaN cladding layer 10 and p-type GaN contact layer 11. The p-type AlGaN cap layer 8 prevents decomposition of InN from the active layer 7 of the $Ga_{1-x}In_xN/Ga_{1-y}In_yN$ multi quantum well structure and prevents overflow of electrons from the active layer 7 during growth of the p-type GaN optical guide layer 9, p-type AlGaN cladding layer 10 and p-type GaN contact layer 11 at a temperature around 1000° C.

The GaN buffer layer 2 is 30 nm thick, for example, and the undoped GaN layer 3 is 1 $\mu$m thick, for example. The n-type GaN contact layer 4 is 4 $\mu$m thick, for example, and is doped with Si, for example, as its n-type impurity. The n-type AlGaN cladding layer 5 is 0.5 $\mu$m thick, for example, and is doped with Si as its n-type impurity. The n-type GaN optical guide layer 6 is 0.1 $\mu$m thick, for example, and is doped with Si, for example as its n-type impurity. The p-type AlGaN cap layer 8 is 20 nm thick, for example, and Mg, for example, is doped as a p-type impurity. The p-type GaN optical guide layer 9 is 0.1 $\mu$m thick, for example, and Mg, for example, is doped as a p-type impurity. The p-type AlGaN cladding layer 10 is 0.5 $\mu$m thick, for example, and Mg, for example, is doped as a p-type impurity. The p-type GaN contact layer 11 is 0.2 $\mu$m thick, for example, and Mg, for example, is doped as a p-type impurity. Al composition ratio in the n-type AlGaN cladding layer 5 and the p-type AlGaN cladding layer 10 is 0.07, for example, and Al composition ratio in the p-type AlGaN cap layer 8 is 0.16, for example. As to the active layer of the $Ga_{1-x}In_xN/Ga_{1-y}In_yN$ multi quantum well structure, x=0.11, y=0.01, thicknesses of $Ga_{1-x}In_xN$ layers and $Ga_{1-y}In_yN$ layers are 3 nm and 6 nm, for example, and the number of wells is four.

An upper-lying portion of the n-type GaN contact layer 4, n-type AlGaN cladding layer 5, n-type GaN optical guide layer 6, active layer 7 with the $Ga_{1-x}In_xN/Ga_{1-y}In_yN$ multi quantum well structure, p-type GaN optical guide layer 9, p-type AlGaN cladding layer 10 and p-type GaN contact layer 11 have a mesa configuration of a predetermined width. A ridge portion 12 of a predetermined width is formed in an upper-lying portion of the p-type AlGaN cladding layer 10 and the p-type GaN contact layer 11 in the mesa portion to extend in one direction. An insulating film 13 such as $SiO_2$ film is provided on the surface of the mesa portion and the exposed surface of the n-type GaN contact layer 4 outside the mesa portion. The insulating film 13 has formed an opening 13a in a location above the ridge portion 12 and an opening 13b in a location above a part of the n-type GaN contact layer 4 adjacent to the mesa portion. A p-side electrode 14 is provided to straddle the ridge portion 12, and it is brought into ohmic contact with the p-type GaN contact layer 11 in the ridge portion 12 through the opening 13a in the insulating film 13. The p-side electrode 14 has a Ni/Pt/Au structure sequentially stacking a Ni film, Pt film and Au film, for example. An n-side electrode 15 is formed on the n-type GaN contact layer 4 in ohmic contact therewith through the opening 13b in the insulating film 13. The n-side electrode 15 has a Ti/Al/Pt/Au structure sequentially stacking a Ti film Al film, Pt film and Au film, for example.

As shown in FIG. 2, in the first embodiment, unlike a conventional GaN semiconductor laser, a number of recesses 1a are formed by a surface density around $10^9$ cm$^{-2}$ on the c-plane sapphire substrate 1 along the boundary with the overlying nitride III–V compound semiconductor, namely, GaN buffer layer 2. Cross-sectional configurations of these recesses 1a may be various, such as triangles, trapezoids, etc., and their plan-view configurations may also various, like hexagons, triangles, circles, and their combinations, as shown in FIGS. 3A to 3F. Size of each recess 1a is, for example, 25 nm or more in depth and 30 nm or more in width. In these recesses 1a, $Al_xGa_{1-x}N$ crystal 16 uniform in crystalline orientation is plugged. Al composition ratio x of the $Al_xGa_{1-x}N$ crystal 16 is 0.2 or more. Distance of moire fringe observed at the portion of the $Al_xGa_{1-x}N$ crystal 16 in an electron microscopic image obtained by exciting (0006) reflection of the sapphire crystal and (0002) reflection of the GaN crystal is 1.37 through 1.67 nm.

Next explained is a manufacturing method of the GaN semiconductor laser according to the first embodiment having the above-explained construction.

Figure 4:
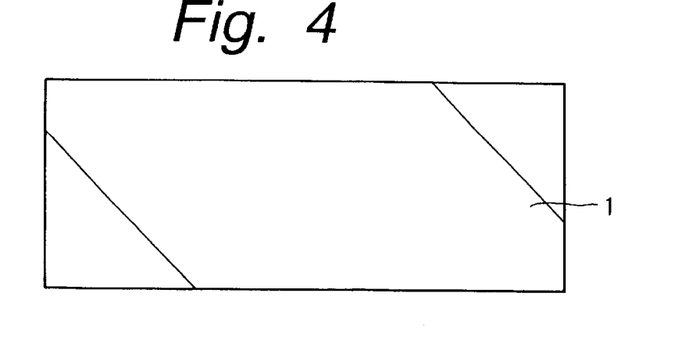
FIG. 4 is a cross-sectional view for explaining a manufacturing method of the GaN semiconductor laser according to the first embodiment of the invention.

For manufacturing the GaN semiconductor, first prepared is the c-plane sapphire substrate 1 having a smoothed and polished surface, as shown in FIG. 4. The c-plane sapphire substrate 1 is introduced into a reaction vessel of a MOCVD apparatus, not shown.

Figure 5:
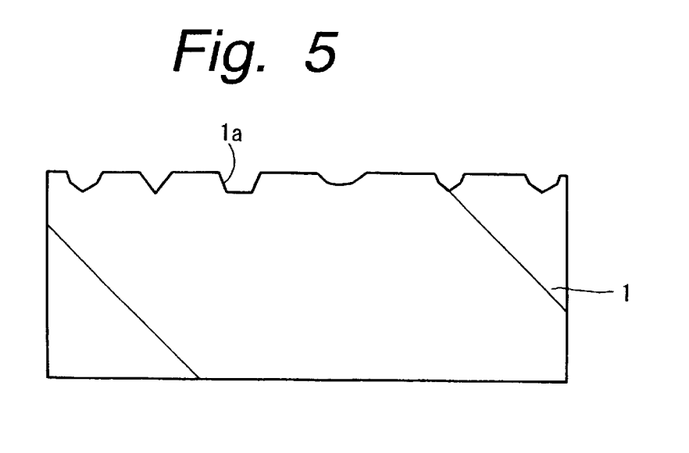
FIG. 5 is a cross-sectional view for explaining a manufacturing method of the GaN semiconductor laser according to the first embodiment of the invention.

After that, in the reaction vessel containing an atmosphere of hydrogen gas, inactive gas such as argon gas, or nitrogen gas, more preferably, a deoxidizing atmosphere such as hydrogen gas, the product is annealed for 1 o 60 minutes, setting the substrate temperature to 1000 through 1300° C., for example, the surface of the c-plane sapphire substrate 1 is processed by thermal cleaning, and recesses 1a are made on the surface as show in FIG. 5. In this process, the temperature and time are adjusted, depending on sizes and configurations of the recesses 1a to be made.

After that, the substrate temperature is decreased to 520° C., for example, and the GaN buffer layer 2 is grown by MOCVD on the surface of the c-plane sapphire substrate 1 having formed the recesses 1a. Then, the substrate temperature is increased to 1000° C., for example, and MOCVD is conducted to sequentially grow on the GaN buffer layer 2 the undoped GaN layer 3, n-type GaN contact layer 4, n-type AlGaN cladding layer 5, n-type GaN optical guide layer 6, active layer 7 with the $Ga_{1-x}In_xN/Ga_{1-y}In_yN$ multi quantum well layer, p-type AlGaN cap layer 8, p-type GaN optical guide layer 9, p-type AlGaN cladding layer 10 and p-type GaN contact layer 11. However, for growth of the active layer 7 having the $Ga_{1-x}In_xN/Ga_{1-y}In_yN$ multi quantum well structure containing In, the substrate temperature is held in 700 through 800° C. Source materials used for growth of these GaN semiconductor layers are, for example, trimethyl gallium (TMG) as the source material of a group III element Ga, trimethyl aluminum (TMA) as the source material of a group III element Al, trimethyl indium (TMI) as the source material of a group III element In, and ammonium ($NH_3$) as the source material of a group V element N. Used as the carrier gas is a mixed gas of hydrogen ($H_2$) and nitrogen ($N_2$), for example. Dopants used here are monosilane ($SiH_4$), for example, as the n-type dopant, and methylcyclopentadienile magnesium (($MCp)_2Mg$), for example, as the p-type dopant.

Figure 6:
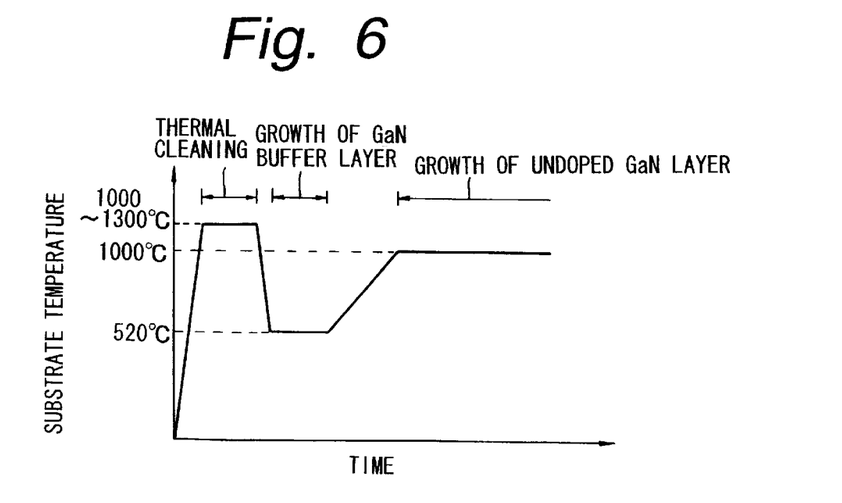
FIG. 6 is a schematic diagram showing a sequence of substrate temperatures in the manufacturing method of the GaN semiconductor laser according to the first embodiment of the invention.

A sequence of substrate temperatures from the thermal cleaning to growth of nitride III–V compound semiconductor layers is shown in FIG. 6.

As a result of annealing while increasing the substrate temperature after growth of the GaN buffer 2, part of the GaN buffer layer plugged into the recesses 1a on the c-plane sapphire substrate 1 is crystallized by solid-phase epitaxial growth, and Al diffuses into the crystal from the c-plane sapphire substrate 1. As a result, $Al_xGa_{1-x}N$ crystal 16 having a uniform crystalline orientation is formed inside the recesses 1a. According to measurement of distances between moire fringes through transmission electron microscopy, this method enables increasing the Al composition ratio x in the $Al_xGa_{1-x}N$ crystal 16 as large as 0.95 in maximum. Additionally, in the process of this crystallization and diffusion of Al, the c-plane sapphire substrate 1 and the $Al_xGa_{1-x}N$ crystal 16 firmly couple to each other by commonly sharing Al. Furthermore, since the $Al_xGa_{1-x}N$ crystal 16 has smaller difference in lattice constant from that of the c-plane sapphire than GaN, the difference in lattice constant between the c-plane sapphire substrate 1 and the GaN buffer layer 2 is alleviated. Moreover, from the entire view of the $Al_xGa_{1-x}N$ crystal 16 and the GaN buffer layer 2 thereon, they form a structure where the Al composition ratio gradually decreases from the bottom to the top, and lattice mismatching withe c-plane sapphire substrate 1 is gradually alleviated. Thus, crystallization of the GaN buffer layer 2 progresses from the $Al_xGa_{1-x}N$ crystal 16 as the core, and a GaN buffer layer 2 with an excellent crystallographic property can be obtained finally. Accordingly, the undoped GaN layer 3, n-type GaN contact layer 4, n-type AlGaN cladding layer 5, n-type GaN optical guide layer 6, active layer 7 with the $Ga_{1-x}In_xN/Ga_{1-y}In_yN$ multi quantum well layer, p-type AlGaN cap layer 8, p-type GaN optical guide layer 9, p-type AlGaN cladding layer 10 and p-type GaN contact layer 11, which grow on the crystallographically excellent GaN buffer layer 2, also result in having good crystallographic properties.

After that, a $SiO_2$ film which is 0.4 μm thick, for example, is formed on the entire surface of the p-type GaN contact layer 11 by CVD, vacuum evaporation or sputtering, for example, and a resist pattern (not shown) of a predetermined configuration is formed on the $SiO_2$ film by lithography. Using the resist pattern as a mask, the $SiO_2$ film is selectively removed by wet etching using an etchant based on fluoric acid, for example, to form a mask (not shown) of the $SiO_2$ film on the p-type GaN contact layer 11.

Thereafter, using the mask, reactive ion etching (RIE) for example, is conducted to the depth reaching the n-type GaN contact layer 4, such that the n-type GaN contact layer 4 is removed by 0.5 μm, for example. Used as the etching gas for RIE is a chlorine-based gas, for example.

After that, the mask is removed, another $SiO_2$ film, which is 0.2 μm, for example, is formed on the entire substrate surface by CVD, vacuum evaporation or sputtering, for example, and a resist pattern (not shown) of a predetermined configuration is made on the $SiO_2$ film by lithography. Using the resist pattern as a mask, the $SiO_2$ film is selectively removed by wet etching using an etchant based on fluoric acid, for example, to form a mask (not shown) of the $SiO_2$ film on the substrate surface including the mesa portion.

Subsequently, using the mask, etching by RIE, for example, is conducted to a predetermined depth in the thickness direction of the p-type GaN contact layer 11 to form a groove as the ridge portion 12. Used as the etching gas for RIE is used a chlorine-based gas, for example.

Next made is a resist pattern (not shown) by lithography to cover the surface of the region excluding the region for the n-side electrode.

Next using the resist pattern as a mask, the insulating film 13 is partly removed by etching to make the opening 13b.

Subsequently, after the Ti film, Al film, Pt film and Au film are sequentially stacked by vacuum evaporation, for example, on the ensure surface of the substrate still covered by the resist pattern, the resist pattern is removed together with the overlying part of the Ti film, Al film, Pt film and Au film (lift-off). As a result, the n-side electrode 15 with the Ti/Al/Pt/Au structure is formed on a location of the n-type GaN contact layer 4 at the opening 13b of the insulating film 13.

After that, by conducting annealing in a nitrogen gas atmosphere at 800° C. for 10 minutes, for example, to activate the p-type impurity doped into the p-type AlGaN cap layer 8, p-type GaN optical guide layer 9, p-type AlGaN cladding layer 10 and p-type GaN contact layer 11 and to alloy the n-side electrode 15.

Next made is a resist pattern (not shown) by lithography to cover the surface of the region excluding the region of the ridge portion 12.

Then using the resist pattern as a mask, the insulating film 13 is selectively removed by etching to make the opening 13a and thereby expose the upper surface of the ridge portion 12.

Thereafter, another resist pattern (not shown) is made by lithography to cover the surface of the region excluding the region for the p-side electrode.

Then, after the Ni film, Pt film and Au film are sequentially stacked on the entire surface of the substrate by vacuum evaporation, for example, the resist pattern 22 is removed together with the overlying part of the Ni film, Pt film and Au film. As a result, the p-side electrode 14 of the Ni/Pt/Au structure is formed to straddle the ridge portion 12 as shown in FIG. 1. Thereafter, annealing is conducted in a nitrogen gas atmosphere at 600° C. for 20 minutes, for example, to alloy the p-side electrode 14.

Subsequently, after processing the c-plane sapphire substrate 1 having formed the laser structure thereon into bars to make opposite cavity edges and coating the edges, the bars are divided into chips. As a result, intended GaN semiconductor lasers with the ridge structure and the SCH structure are obtained.

As explained above, according to the first embodiment, the GaN buffer layer 2 is entirely crystallized by first making recesses 1a on a major surface of the c-plane sapphire substrate 1, then growing the GaN buffer layer 2 on the major surface at the substrate temperature of 520° C., thereafter increasing the substrate temperature to 1000° C. so that part of the GaN buffer layer 2 plugged into the recesses 1a be crystallized by solid-phase growth while incorporating Al diffused thereto to form $Al_xGa_{1-x}N$ crystal 16, and then crystallizing the entire GaN buffer layer 2 from the $Al_xGa_{1-x}N$ crystal 16 as the core. Therefore, the undoped GaN layer 3, n-type GaN contact layer 4, n-type AlGaN cladding layer 5, n-type GaN optical guide layer 6, active layer 7 with the $Ga_{1-x}In_xN/Ga_{1-y}In_yN$ multi quantum well layer, p-type AlGaN cap layer 8, p-type GaN optical guide layer 9, p-type AlGaN cladding layer 10 and p-type GaN contact layer 11, which grow on the GaN buffer layer 2, also have excellent crystallographic properties. As a result, GaN semiconductor lasers with high performance, long lifetime and high reliability can be realized.

Next explained is the second embodiment of the invention.

In the second embodiment, similarly to the first embodiment, after the recesses 1a are made on the surface of the c-plane sapphire substrate, the surface of the c-plane sapphire substrate 1 is exposed to a source material gas containing nitrogen, such as ammonium gas, under a high temperature around 1000° C., for example, to nitrify it and thereby make a nitride layer containing Al and N. After that, the step of growing the GaN buffer layer 2 and subsequent steps are progressed similarly to the first embodiment to obtain an intended GaN semiconductor laser.

According to the second embodiment, the following advantages are obtained in addition to the same advantages as those of the first embodiment. That is, since the GaN buffer laser 2 is grown after first making the recesses 1a on the surface of the c-plane sapphire substrate 1 and then making the nitride layer on the surface, Al diffuses into the GaN buffer layer 2 while Ga diffuses into the nitride layer to the contrary, due to diffusion and reaction of Al between the nitride layer and the GaN buffer layer 2 plugged into the recesses 1a. As a result, diffusion of Al is greatly promoted, and this is advantageous for making $Al_xGa_{1-x}N$ crystal 16 having a higher Al composition ratio x.

Next explained is the third embodiment of the invention.

Figure 7:
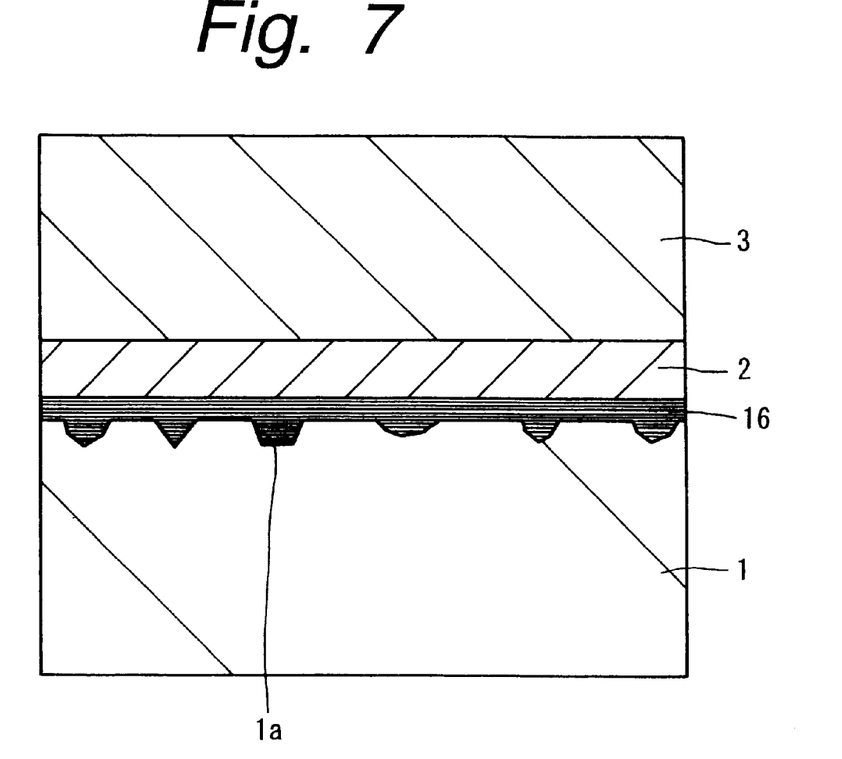
FIG. 7 is a cross-sectional view for explaining a manufacturing method of a GaN semiconductor laser according the third embodiment of the invention.

As shown in FIG. 7, in a GaN semiconductor laser taken as the third embodiment of the invention, $Al_xGa_{1-x}N$ crystal 16 having a uniform crystalline orientation is made on the entire interface between the c-plane sapphire substrate 1 and the GaN buffer layer 2 to bury the recesses 1a. In the other respects, the laser shown here is the same as the GaN semiconductor laser according to the first embodiment.

The third embodiment also ensures the same advantages as those of the first embodiment.

Next explained is the fourth embodiment of the invention.

Figure 8:
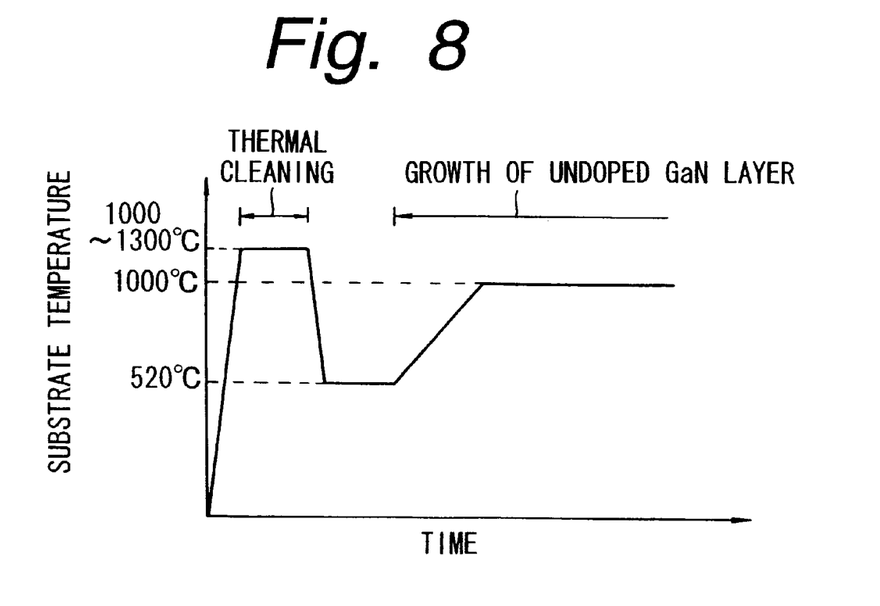
FIG. 8 is a schematic diagram showing a sequence of substrate temperatures in the manufacturing method of the GaN semiconductor laser according to the fourth embodiment of the invention.

In the fourth embodiment, after the recesses 1a are made on the surface of the c-plane sapphire substrate in the same manner as the first embodiment, the substrate temperature is once decreased to 520° C., and gradually raised therefrom to 1000° C. to grow the undoped GaN layer 2 directly on the c-plane sapphire substrate 1. Thereafter, the n-type GaN contact layer 3 and other layers are grown thereon in the same manner as the first embodiment. A sequence of substrate temperatures from the thermal cleaning to growth of the nitride III–V compound semiconductor layers is shown in FIG. 8.

According to the fourth embodiment, since crystallization of the undoped GaN layers 2 starts from the recesses 1a of the c-plane sapphire substrate 1, excellent crystallographic property is ensured throughout the entire undoped GaN layer 2, and this results in improving the crystallographic property of the nitride III–V compound semiconductor layer grown thereon.

Next explained is the fifth embodiment of the invention.

Figure 9:
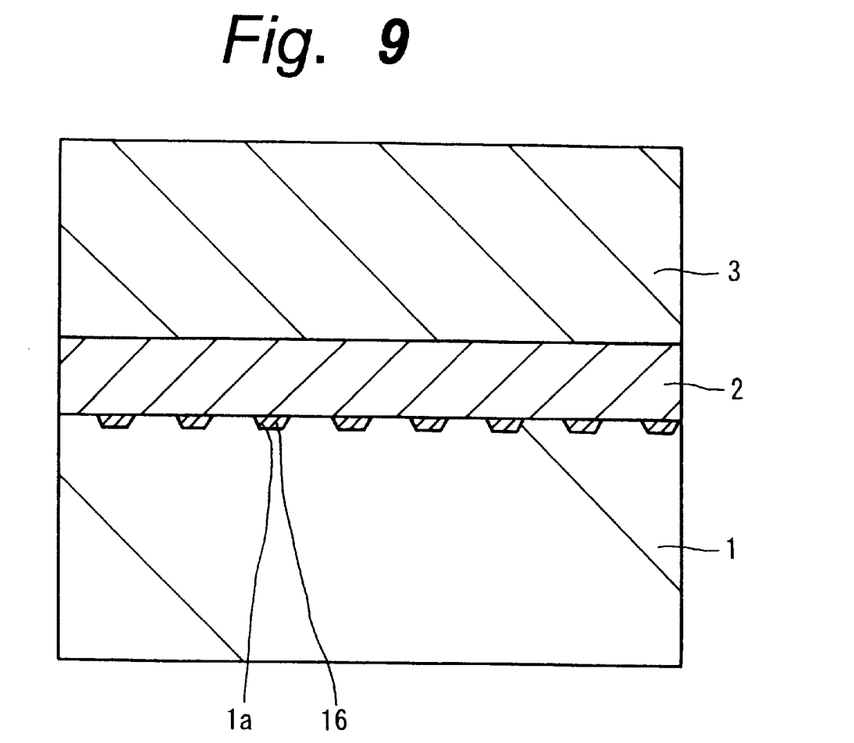
FIG. 9 is a cross-sectional view showing a part of a GaN semiconductor laser according to the fifth embodiment of the invention in an enlarged scale.
Figure 10:
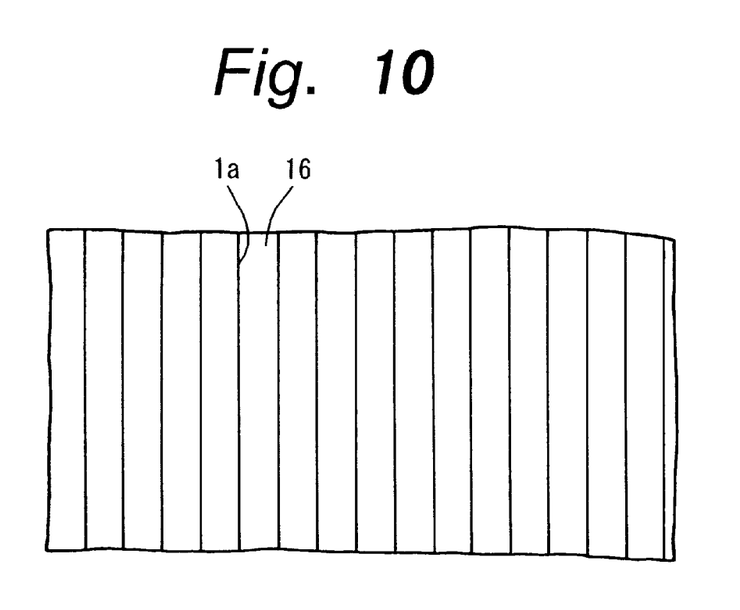
FIG. 10 is a cross-sectional view for explaining a manufacturing method of the GaN semiconductor laser according the fifth embodiment of the invention.

As shown in FIGS. 9 and 10, in a GaN semiconductor laser according to the fifth embodiment, a plurality of straight recesses 1a are made on the surface of the c-lane sapphire substrate 1 to extend in parallel with each other in one direction (for example, <11-20> direction), and $Al_xGa_{1-x}N$ crystal 16 is plugged into the recesses 1a. In the other respects, the embodiment shown here is the same as the first embodiment.

The GaN semiconductor laser according to the fifth embodiment can be manufactured by the same manufacturing method of the GaN semiconductor laser according to the first embodiment, except that the process of making the recesses 1a on the c-plane sapphire substrate is different. In the fifth embodiment, the recesses 1a are made by first making a resist pattern (not shown) in form of predetermined stripes by lithography on the c-plane sapphire substrate 1 having a smoothed and polished surface, and then etching the c-plane sapphire substrate 1 by dry etching to a predetermined depth, using the resist pattern as a mask.

The fifth embodiment also ensures the same advantages as those of the first embodiment.

Next explained is the sixth embodiment of the invention.

Figure 11:
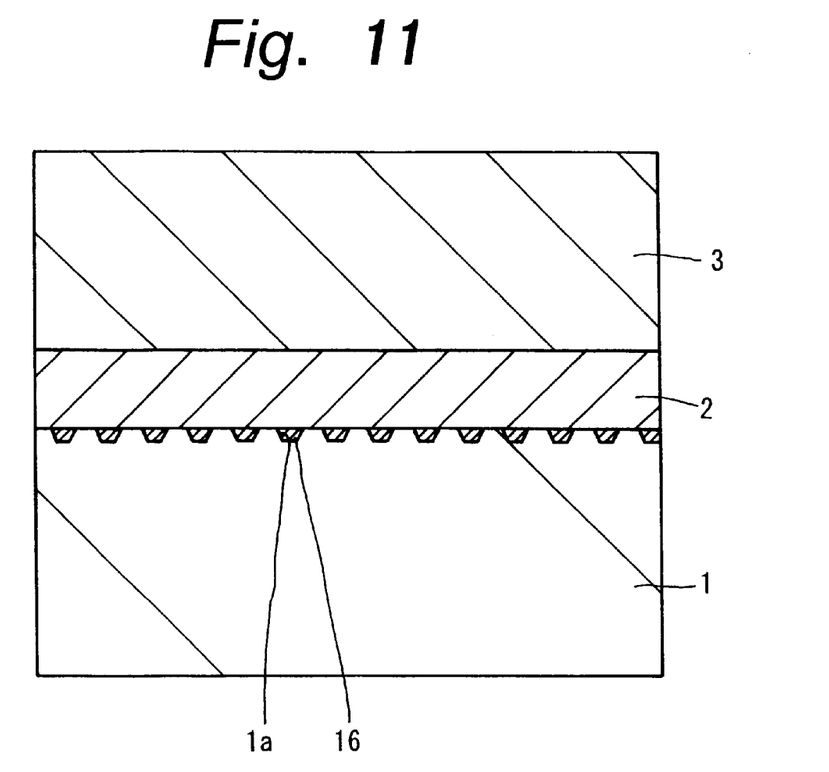
FIG. 11 is a cross-sectional view showing a part of a GaN semiconductor laser according to the sixth embodiment of the invention in an enlarged scale.
Figure 12:
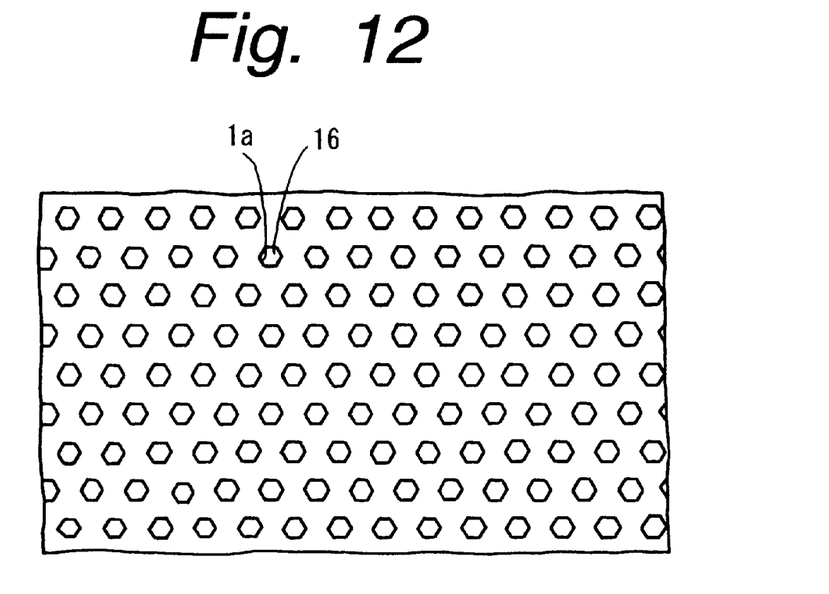
FIG. 12 is a cross-sectional view for explaining a manufacturing method of the GaN semiconductor laser according the sixth embodiment of the invention.

As shown in FIGS. 11 and 12, in a GaN semiconductor laser according to the sixth embodiment, recesses 1a having a hexagonal plan-view configuration are made in a two-dimensional array, and $Al_xGa_{1-x}N$ crystal 16 is buried into the recesses 1a. In the other respects, the embodiment shown here is the same as the first embodiment.

The GaN semiconductor laser according to the sixth embodiment can be made by the same manufacturing method of the GaN semiconductor laser according to the first embodiment, except that the process of making the recesses 1a on the c-plane sapphire substrate is different. That is, in the sixth embodiment, the recesses 1a are made by first making a resist pattern (not shown) of an arrangement of predetermined hexagons by lithography on the sapphire substrate with a smoothed and polished surface, and next etching the c-plane sapphire substrate 1 to a predetermined depth by dry etching, using the resist pattern as a mask.

The sixth embodiment also ensures the same advantages as those of the first embodiment.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

For example, numerical values, structures, source materials and processes introduced in the explanation of the first to sixth embodiments are not but examples, and any other appropriate numerical values, structures, source materials and processes may be used.

The first to fourth embodiment have been explained as making the recesses 1a by thermal cleaning of the surface of the c-plane sapphire substrate in a reaction vessel of a MOCVD apparatus. However, it also possible to first use a different apparatus for making the recesses 1a by thermal cleaning of the surface of the c-plane sapphire substrate, then moves the c-plane sapphire substrate 1 to the reaction vessel of a MOCVD apparatus to once again conduct thermal cleaning and thereafter grow the layers.

In the first to third, fifth and sixth embodiments, the GaN buffer layer 2 is grown as the buffer layer. However, generally usable as the buffer layer is a $Ga_{1-x-y}In_yN$ ($0 \leq x \leq 1$, $0 \leq y \leq 1$, $0 \leq x+y \leq 1$) layer.

Although the first to sixth embodiments have been explained as applying the invention to GaN semiconductor lasers having a SCH structure, the invention is also applicable to GaN semiconductor lasers having a DH structure (double heterostructure). It is possible to use a single quantum well structure to form the active layer 7. From the viewpoint of laser structure, the invention can employ various types of laser structures such as ridge-guided structure, internal current blocking structure, structural substrate type, longitudinal mode control structure (lasers of a distributed feedback (DFB) type or distributed Bragg reflection type (DBR) which realize gain-guided structures or index-guided structures. Additionally, the invention is also applicable to GaN light emitting diodes, and GaN FETs or other electron mobility devices.

As described above, according to the invention, since a plurality of recesses are made on a major surface of a sapphire substrate, growth of a nitride III–V compound semiconductor layer on the sapphire substrate can be controlled by a plurality of crystalline directions and crystalline surfaces. Therefore, accurate coincidence in crystalline orientation is ensured between the sapphire substrate and the nitride III–V compound semiconductor grown thereon, and the nitride III–V compound semiconductor is therefore ensured to exhibit excellent crystallographic property.

What is claimed is:

1. A semiconductor device using a nitride III–V compound semiconductor layer grown on a sapphire substrate, comprising:

recesses made on said sapphire substrate along an interface thereof with said nitride III–V compound semiconductor layer, wherein said nitride III–V compound semiconductor crystal having a larger Al composition ratio than said nitride III–V compound semiconductor layer is buried inside said recesses.

2. The semiconductor device according to claim 1 wherein each said recess has a depth not less than 10 nm and a width not less than 30 nm.

3. The semiconductor device according to claim 1 wherein said nitride III–V compound semiconductor layer is made of $Al_{x1}Ga_{1-x1-y1}In_{y1}N$ ($0 \leq x1 \leq 1$, $0 \leq y1 \leq 1$, $0 \leq x1+y1 \leq 1$), said nitride III–V compound semiconductor crystal is made of $Al_{x2}Ga_{1-x2-y2}In_{y2}N$ ($0 \leq x2 \leq 1$, $0 \leq y2 \leq 1$, $0 \leq x2+y2 \leq 1$), and $x2-x1 \geq 0.1$.

4. The semiconductor device according to claim 1 wherein said nitride III–V compound semiconductor layer is a GaN layer, and said nitride III–V compound semiconductor crystal is made of $Al_xGa_{1-x}N$ where $0.2 \leq x \leq 1$.

5. The semiconductor device according to claim 4 wherein moire fringes with a distance from 1.37 to 1.67 nm are observed in portions of said recesses in a transmission electron microscopic image taken by exciting at least (0002) reflection of said nitride III–V compound semiconductor crystal and (0006) reflection of sapphire crystal.

6. A semiconductor device using a nitride III–V compound semiconductor layer grown on a sapphire substrate, comprising:

recesses made on said sapphire substrate along an interface thereof with said nitride III–V compound semiconductor layer, wherein said nitride III–V compound semiconductor crystal having a larger Al composition ratio than said nitride III–V compound semiconductor layer is provided along the interface between said sapphire substrate and said nitride III–V compound semiconductor layer to plug said recesses.

7. The semiconductor device according to claim 6 wherein said nitride III–V compound semiconductor layer is made of $Al_{x1}Ga_{1-x1-y1}In_{y1}N$ ($0 \leq x1 \leq 1$, $0 \leq y1 \leq 1$, $0 \leq x1+y1 \leq 1$), said nitride III–V compound semiconductor crystal is made of $Al_{x2}Ga_{1-x2-y2}In_{y2}N$ ($0 \leq x2 \leq 1$, $0 \leq y2 \leq 1$, $0 \leq x2+y2 \leq 1$), and $x2-x1 \geq 0.1$.

8. The semiconductor device according to claim 6, wherein said nitride III–V compound semiconductor crystal is made of $Al_xGa_{1-x}N$ where $0.2 \leq x \leq 1$.

9. The semiconductor device according to claim 8 wherein moire fringes with a distance from 1.37 to 1.67 are observed in portions of said recesses in a transmission electron microscopic image taken by exciting at least (0002) reflection of said nitride III–V compound semiconductor crystal and (0006) reflection of sapphire crystal.

10. A semiconductor device using a nitride III–V compound semiconductor layer grown on a sapphire substrate, comprising:

recesses made on said sapphire substrate along an interface thereof with said nitride III–V compound semiconductor layer, wherein said nitride III–V compound semiconductor crystal is plugged inside said recesses, and moire fringes are observed in a transmission electron microscopic image of the portion of said nitride III–V compound semiconductor crystal.

11. A semiconductor device using a nitride III–V compound semiconductor layer grown on a sapphire substrate, comprising:

recesses made on said sapphire substrate along an interface thereof with said nitride III–V compound semiconductor layer, wherein said nitride III–V compound semiconductor crystal is plugged inside said recesses, and moire fringes with a distance from 1.37 to 1.67 nm are observed in portions of said recesses in a transmission electron microscopic image taken by exciting at least (0002) reflection of said nitride III–V compound semiconductor crystal and (0006) reflection of said sapphire crystal.

* * * * *